(12) United States Patent
Lim et al.

(10) Patent No.: US 10,768,660 B2
(45) Date of Patent: Sep. 8, 2020

(54) LIGHT-EMITTING AUDIO DEVICE, AUDIO OUTPUT DEVICE, AND DISPLAY DEVICE

(71) Applicant: LG Display Co., Ltd., Seoul (KR)

(72) Inventors: KiSung Lim, Gyeonggi-do (KR); DongRyul Jung, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 7 days.

(21) Appl. No.: 16/128,983

(22) Filed: Sep. 12, 2018

(65) Prior Publication Data
US 2019/0187748 A1    Jun. 20, 2019

(30) Foreign Application Priority Data

Dec. 19, 2017 (KR) ........................ 10-2017-0174738

(51) Int. Cl.
| | |
|---|---|
| *G06F 1/16* | (2006.01) |
| *H04R 9/06* | (2006.01) |
| *H01L 41/047* | (2006.01) |
| *H01L 33/36* | (2010.01) |
| *H04R 1/02* | (2006.01) |
| *H04R 17/00* | (2006.01) |

(52) U.S. Cl.
CPC ............ *G06F 1/1605* (2013.01); *H01L 33/36* (2013.01); *H01L 41/0471* (2013.01); *H04R 1/028* (2013.01); *H04R 9/063* (2013.01); *H04R 17/00* (2013.01); *H04R 2499/15* (2013.01)

(58) Field of Classification Search
CPC .... G06F 1/1605; G06F 1/1607; G06F 1/1603; G06F 1/1609; H01L 33/36; H01L 33/385; H01L 33/387; H01L 33/42; H01L 41/0471; H01L 41/0472; H01L 41/0474; H04R 1/028; H04R 17/005; H04R 17/025; H04R 19/01; H04R 2499/15; H04R 2499/11
See application file for complete search history.

(56) References Cited

U.S. PATENT DOCUMENTS

| | | | | |
|---|---|---|---|---|
| 7,108,400 | B2 * | 9/2006 | Yamada | F21K 9/00 |
| | | | | 362/294 |
| 2008/0210957 | A1 * | 9/2008 | Watanabe | H01L 21/0242 |
| | | | | 257/89 |
| 2012/0074441 | A1 * | 3/2012 | Seo | H01L 27/153 |
| | | | | 257/91 |
| 2016/0013388 | A1 * | 1/2016 | Lee | H01L 27/156 |
| | | | | 257/13 |
| 2017/0155028 | A1 * | 6/2017 | Kiyose | B06B 1/0622 |
| 2019/0087004 | A1 * | 3/2019 | Fan | G06F 1/1652 |
| 2019/0189953 | A1 * | 6/2019 | Zhou | F21K 9/68 |

* cited by examiner

*Primary Examiner* — Fan S Tsang
*Assistant Examiner* — Angelica M McKinney
(74) *Attorney, Agent, or Firm* — Morgan, Lewis & Bockius LLP

(57) ABSTRACT

A light-emitting audio device, an audio output device, and a display device. The light-emitting audio device includes a micro device integrated with a micro LED device and piezoelectric device. Both image display and audio output can be enabled using a single device. Audio is output using a plurality of light-emitting audio devices disposed in a plurality of subpixels, respectively. An increase in the thickness of the display device due to integrate with a audio function can be minimized. A variety of audio output functions are provided by driving the light-emitting audio devices according to areas.

19 Claims, 10 Drawing Sheets

LIGHT-EMITTING AUDIO DEVICE, AUDIO OUTPUT DEVICE, AND DISPLAY DEVICE

CROSS REFERENCE TO RELATED APPLICATION

This application claims priority from Korean Patent Application No. 10-2017-0174738, filed on Dec. 19, 2017, which is hereby incorporated by reference for all purposes as if fully set forth herein.

BACKGROUND

Technical Field

Exemplary embodiments of the present disclosure relate to a light-emitting audio device, an audio output device, and a display device.

Description of Related Art

In response to the development of the information society, there has been increasing demand for display devices able to display images. Recently, a range of display devices, such as liquid crystal display (LCD) devices, plasma display devices, and organic light-emitting display devices, have come into widespread use.

Such a display device may include a display panel on which a plurality of subpixels are disposed, as well as a variety of driver circuits, such as a gate driver circuit and a data driver circuit, for driving the display panel.

In a display device of the related art, a display panel is constructed by disposing transistors, a variety of electrodes, a variety of signal lines, and the like on a glass substrate. A driver circuit, capable of being provided as an integrated circuit (IC), is mounted on a printed circuit board (PCB) to be electrically connected to the display panel.

Such display panels are designed to provide thinner and lighter display devices, in response to the ongoing technological development.

Recently, display devices using a microscopic light-emitting diode (μLED) having a structure suitable for small display devices have been introduced. μLEDs refer to microscopic LEDs having a size in a range of tens of micrometers or less (hereinafter referred to as "micro display devices").

Such micro display devices can be advantageously used in a variety of applications, such as smartwatches, mobile devices, virtual reality devices, augmented reality devices, and flexible devices, since the size and weight thereof can be reduced due to such μLEDs being used as pixels.

Although a display panel can be provided with a thin and small profile, the thickness or size of the display device may not be reduced, due to essential components of the display device, other than the display panel.

For example, since the display device must include a speaker to output audio, the bezel or the thickness of the display panel must be reduced to dispose the speaker in the display device. Even if the display panel can be provided while having a reduced thickness and size, the extent of reducing the thickness of the display device for the provision of the speaker is limited.

Since audio output is an essential function in the display device, a solution able to provide a display device having both a thin and lightweight profile and an audio output function is required.

SUMMARY

Accordingly, embodiments of the present disclosure are directed to a light-emitting audio device, an audio output device, and a display device that substantially obviate one or more of the problems due to limitations and disadvantages of the related art.

An aspect of the present disclosure is provide a light-emitting audio device able to display an image and output audio, and an audio output device and a display device including the light-emitting audio device.

Another aspect of the present disclosure is to provide a light-emitting audio device enabling display driving and audio output to be performed according to areas of a display panel, and an audio output device and a display device including the light-emitting audio device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a light-emitting audio device may comprise: a light-emitting diode (LED) including a first semiconductor layer, a second semiconductor layer, and an active layer disposed between the first semiconductor layer and the second semiconductor layer; a piezoelectric device including a first electrode layer, a second electrode layer, and a piezoelectric material disposed between the first electrode layer and the second electrode layer; an insulator disposed between the LED and the piezoelectric device; a protective portion disposed on a top surface of at least one of the LED and the piezoelectric device; and a plurality of electrodes located on the protective portion to be electrically connected to the LED or the piezoelectric device.

In another aspect, an audio output device may comprise: a substrate; a plurality of light-emitting audio devices disposed on the substrate; and a first driver circuit and a second driver circuit driving the plurality of light-emitting audio devices. Each of the plurality of light-emitting audio devices may include: an LED including a first semiconductor layer, a second semiconductor layer, and an active layer disposed between the first semiconductor layer and the second semiconductor layer; a piezoelectric device including a first electrode layer, a second electrode layer, and a piezoelectric material disposed between the first electrode layer and the second electrode layer; an insulator disposed between the LED and the piezoelectric device; a protective portion disposed on a top surface of at least one of the LED and the piezoelectric device; and a plurality of electrodes located on the protective portion to be electrically connected to the LED or the piezoelectric device.

In another aspect, a display device may comprise: a panel on which a plurality of gate lines, a plurality of data lines, and a plurality of subpixels are disposed; a plurality of light-emitting audio devices disposed in the plurality of subpixels, respectively; and a first driver circuit and a second driver circuit driving the plurality of light-emitting audio devices. Each of the plurality of light-emitting audio devices may include: an LED including a first semiconductor layer, a second semiconductor layer, and an active layer disposed between the first semiconductor layer and the second semiconductor layer; a piezoelectric device including a first electrode layer, a second electrode layer, and a piezoelectric material disposed between the first electrode layer and the second electrode layer; an insulator disposed between the LED and the piezoelectric device; a protective portion disposed on a top surface of at least one of the LED and the piezoelectric device; and a plurality of electrodes located on the protective portion to be electrically connected to the LED or the piezoelectric device.

According to exemplary embodiments, in the light-emitting audio device, the μLED and the piezoelectric device are integrated with each other, such that both image display and audio output can be enabled using a single device.

According to exemplary embodiments, the display device is provided using the light-emitting audio device able to display an image and output audio. The display device can be provided as a lighter and thinner display device. In addition, display driving and audio output can be performed, according to the areas of the display panel.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
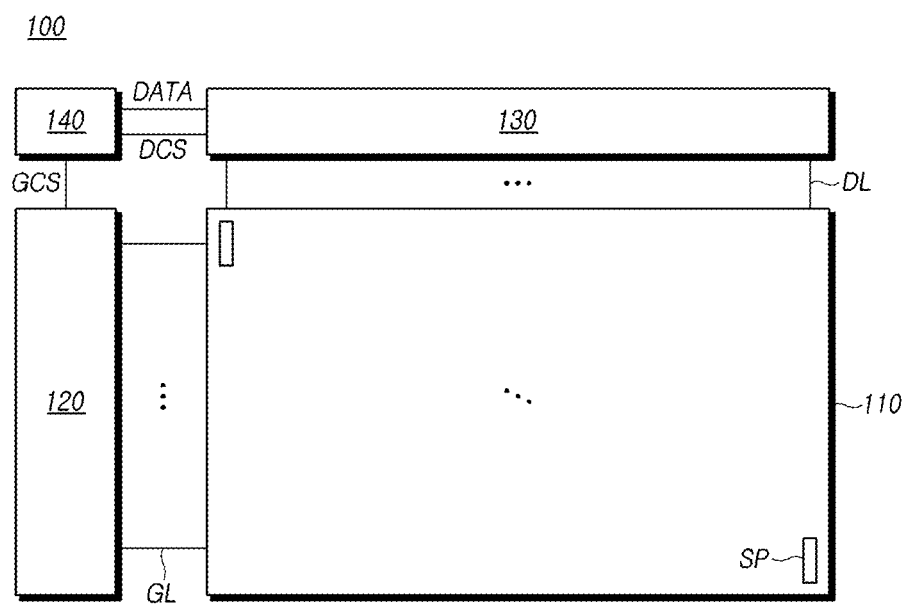
FIG. 1 illustrates a schematic configuration of a display device according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from other elements. The substance, sequence, order, or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 illustrates a schematic configuration of a display device 100 according to exemplary embodiments.

Referring to FIG. 1, the display device 100 according to exemplary embodiments may include a display panel 110 on which a plurality of subpixels SP, including light-emitting devices, are disposed, a gate driver circuit 120 driving the display panel 110, a data driver circuit 130, a controller 140, and the like.

A plurality of gate lines GL and a plurality of data lines DL are arranged on the display panel 110, and a plurality of subpixels SP are arranged in areas in which the gate lines GL intersect the data lines DL. Each of the subpixels SP may include a light-emitting device, and two or more subpixels SP may form a single pixel.

The gate driver circuit 120 is controlled by the controller 140 to control the driving timing of the plurality of subpixels SP by sequentially outputting a scanning signal to the plurality of gate lines GL.

The gate driver circuit 120 may include one or more gate driver integrated circuits (GDICs), and may be disposed on one or both sides of the display panel 110 depending on the driving system. In addition, the gate driver circuit 120 may be located on the rear surface of the display panel 110.

The data driver circuit 130 receives image data from the controller 140, converts the image data into analog data voltages, and outputs the data voltages to the data lines DL at the timing of the scanning signal being applied through the gate lines GL, so that the subpixels SP express brightness levels according to the image data.

The data driver circuit 130 may include one or more source driver integrated circuits (SDICs).

The controller 140 transfers a variety of control signals to the gate driver circuit 120 and the data driver circuit 130 to control the operation of the gate driver circuit 120 and the data driver circuit 130.

The controller 140 controls the gate driver circuit 120 to output a scanning signal based on timing realized in each frame. The controller 140 converts image data input from an external source into a data signal format readable by the data driver circuit 130 before outputting converted image data to the data driver circuit 130.

The controller 140 receives a variety of timing signals, including a vertical synchronization (Vsync) signal, a horizontal synchronization (Hsync) signal, an input data enable (DE) signal, a clock signal, and the like, in addition to input image data, from an external source (e.g. a host system).

The controller 140 can generate a variety of control signals using a variety of timing signals received from an external source and output the variety of control signals to the gate driver circuit 120 and the data driver circuit 130.

For example, the controller 140 outputs a variety of gate control signals (GCSs), including a gate start pulse (GSP), a gate shift clock (GSC), a gate output enable (GOE) signal, and the like, to control the gate driver circuit 130.

Among these signals, the GSP controls the operation start timing of one or more GDICs of the gate circuit 130. The GSC is a clock signal commonly input to one or more GDICs to control the shift timing of a scanning signal (or gate pulse). The GOE signal designates timing information of one or more GDICs.

In addition, the controller 140 outputs a variety of data driving control signals, including a source start pulse (SSP), a source sampling clock (SSC), a source output enable (SOE) signal, and the like, to control the data driver circuit 120.

Among these signals, the SSP controls the data sampling start timing of one or more SDICs of the data driver circuit 120. The SSC is a clock signal controlling the sampling timing of data in each of SDICs. The SOE signal controls the output timing of the data driver circuit 120.

The display device 100 may further include a power management integrated circuit (PMIC) to supply a variety of voltages or currents to the display panel 110, the gate driver circuit 120, the data driver circuit 130, and the like or control the variety of voltages or currents to be supplied to the same.

In addition to the gate lines GL and the data lines DL, power lines allowing a variety of signals or voltages to be supplied therethrough may be disposed on (or in) the display panel 110. A light-emitting device and a transistor for driving the light-emitting device may be disposed in each of the subpixels SP.

Figure 2:
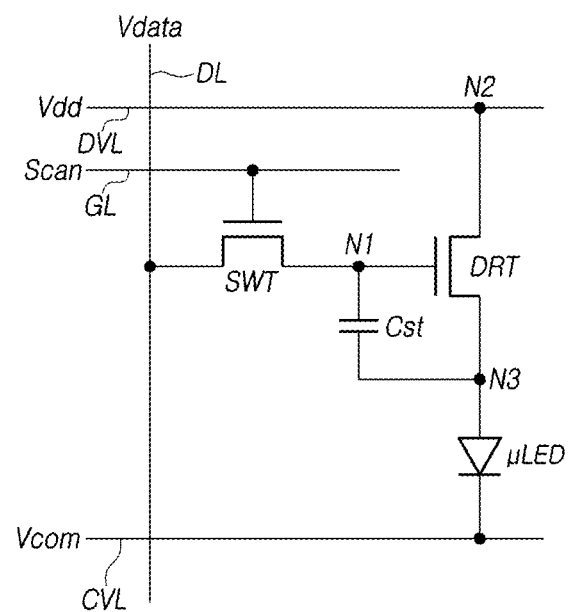
FIG. 2 illustrates an exemplary circuit structure of the subpixel disposed in the display panel of the display device according to exemplary embodiments.

FIG. 2 illustrates an exemplary circuit structure of the subpixel SP disposed in the display panel 110 of the display device 100 according to exemplary embodiments (an exemplary circuit structure for transmitting acoustic signals is not shown). The exemplary subpixel SP is provided using a microscopic light-emitting diode (μLED).

Referring to FIG. 2, in the subpixel SP disposed on the display panel 110 of the display device 100 according to exemplary embodiments, a gate line GL and a data line DL are disposed to intersect each other. In addition, a driving voltage line DVL, along which a driving voltage Vdd is supplied, and a common voltage line CVL, along which a common voltage is supplied, may be disposed in the subpixel SP.

In the subpixel SP, in addition to the μLED, i.e. a microscopic light-emitting device, a driving transistor DRT driving the μLED, a switching transistor SWT controlling the operating timing of the driving transistor DRT, a storage capacitor Cst, and the like may be disposed.

The switching transistor SWT is electrically connected between the data line DL and a first node N1 of the driving transistor DRT. The switching transistor SWT is turned on by a scanning signal applied to the gate line GL to direct a data voltage Vdata to the first node N1 of the driving voltage DRT.

In response to the data voltage Vdata applied to the first node N1, the driving transistor DRT directs a driving voltage Vdd to an anode of the μLED.

The storage capacitor Cst is electrically connected to the first node N1 and a third node N3 of the driving transistor DRT. The storage capacitor Cst can maintain the data voltage Vdata applied to the first node N1 for a single frame.

The μLED has an anode, to which the driving voltage Vdd, supplied depending on the data voltage Vdata, is applied, and a cathode, to which the common voltage Vcom is applied. In addition, the μLED can exhibit a level of brightness depending on the difference in the voltage between the anode and the cathode.

Although the anode of the μLED may be connected to the third node N3 of the driving transistor DRT, the μLED may be connected to the driving voltage line DVL. Specifically, any structures of the μLED in which one electrode of the anode and the cathode is connected to the driving transistor DRT and the other electrode is connected to the common voltage line CVL or the driving voltage line DVL may be embraced within the scope of exemplary embodiments.

Since the display device 100 is provided using the μLEDs, i.e. microscopic light-emitting devices, the display device 100 can have a small and light structure.

In addition, according to exemplary embodiments, a device able to output audio may be provided integrally with the μLED, such that the display device 100 can output audio without an additional speaker attached thereto.

Figure 3:
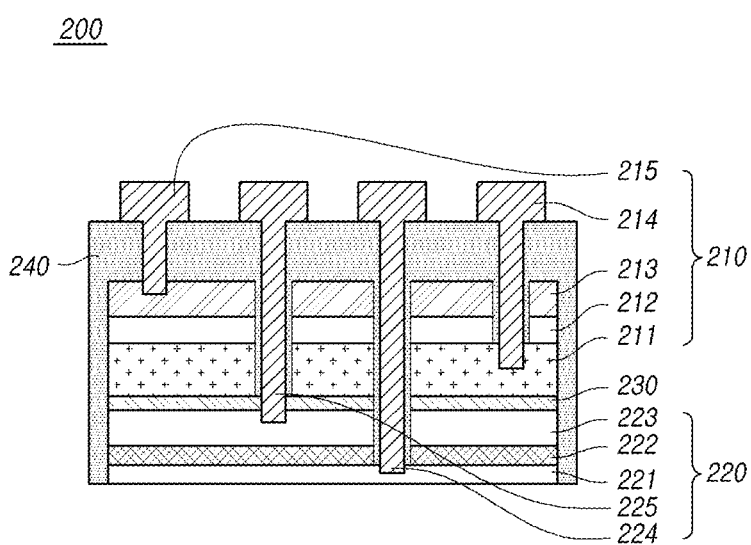
FIG. 3 illustrates an exemplary cross-sectional structure of a light-emitting audio device according to exemplary embodiments.

FIG. 3 illustrates an exemplary cross-sectional structure of a light-emitting audio device 200 according to exemplary embodiments.

Referring to FIG. 3, the light-emitting audio device 200 according to exemplary embodiments may include a microscopic light-emitting diode (μLED) 210, a piezoelectric device 220, an insulator 230, and a protective portion 240.

The μLED 210 may include a first semiconductor layer 211, an active layer 212, and a second semiconductor layer 213. The LED 210 may further include a first light-emitting electrode 214 electrically connected to the first semiconductor layer 211 and a second light-emitting electrode 215 electrically connected to the second semiconductor layer 213.

The first semiconductor layer 211 may be a semiconductor layer in which negative free electrons move as carriers to generate current, and may be an n-semiconductor layer made of an n-GaN-based material. The n-GaN-based material may be one selected from among, but is not limited to, GaN, AlGaN, InGaN, and AlInGaN. Impurities used for doping of the first semiconductor layer 211 may include, but are not limited to, Si, Ge, Se, Te, and C.

The active layer 212 may be disposed on the first semiconductor layer 211. The active layer 212 may have a multiple quantum well (MQW) structure comprised of well layers and barrier layers having a higher band gap than the well layers. The active layer 212 may have an MQW structure made of InGaN/GaN or the like.

The second semiconductor layer 213 may be a semiconductor layer in which positive holes moving as carriers generate current. The second semiconductor layer 213 may be a semiconductor layer made of a p-GaN material. The p-GaN material may be one selected from among, but is not limited to, GaN, AlGaN, InGaN, and AlInGaN. Impurities used for doping of the second semiconductor layer 213 may include, but are not limited to, Mg, Zn, and Be.

The first light-emitting electrode 214 and the second light-emitting electrode 215 may be disposed on the protective portion 240 covering the top surface and the side surfaces of the μLED 210. The protective portion 240 may be made of an insulating material. For example, the protective portion 240 may be made of, but is not limited to, $SiO_2$.

The first light-emitting electrode 214 may be electrically connected to the first semiconductor layer 211 through a via-hole extending through the protective layer 240, the second semiconductor layer 213, and the active layer 212. The first light-emitting electrode 214 may be disposed to be insulated from the second semiconductor layer 213 and the active layer 212. The first light-emitting electrode 214 may be a cathode.

The second light-emitting electrode 215 may be electrically connected to the second semiconductor layer 213 through a via-hole extending through the protective layer 240. The second light-emitting electrode 215 may be an anode.

When a positive voltage is applied through the second light-emitting electrode 215 and a negative voltage is applied through the first light-emitting electrode 214, a current flow is allowed between the first light-emitting electrode 214 and the second light-emitting electrode 215, in response to electrons moving in the first semiconductor layer 211 and holes moving in the second semiconductor layer 213. When electrons and holes are recombined along with the current flow between the first light-emitting electrode 214 and the second light-emitting electrode 215, the active layer 213 generates light.

The piezoelectric device 220 may be located below the μLED 210. The insulator 230 may be disposed between the μLED 210 and the piezoelectric device 220.

The piezoelectric device 220 may include a first electrode layer 221, a piezoelectric material 222, and a second electrode layer 223. The piezoelectric device 220 may further include a first audio electrode 224 electrically connected to the first electrode layer 221 and a second audio electrode 225 electrically connected to the second electrode layer 223.

The first electrode 221 may be made of a transparent conductive material. For example, the first electrode 221 may be made of, but is not limited to, indium tin oxide (ITO) or indium zinc oxide (IZO). The first electrode 221 may be an n-doped electrode.

The first electrode 221 may be electrically connected to the first audio electrode 224 disposed on the protective portion 240. The first audio electrode 224 may be electrically connected to the first electrode layer 221 through a via-hole extending through the protective layer 240, the second semiconductor layer 213, the active layer 212, the first semiconductor layer 211, the insulator 230, the second electrode layer 223, and the piezoelectric material 222. The first audio electrode 224 may be disposed to be insulated from the components, other than the first electrode layer 221, by an insulating material disposed within the via-hole.

The second electrode layer 223 may be made of a transparent conductive material, which is p-doped.

The second electrode layer 223 may be electrically connected to the second audio electrode 225 disposed on the protective portion 240. The second audio electrode 225 may be electrically connected to the second electrode layer 223 through a via-hole extending through the protective layer 240, the second semiconductor layer 213, the active layer 212, the first semiconductor layer 211, and the insulator 230. The second audio electrode 225 may be disposed to be insulated from the components other than the second electrode layer 223 by an insulating material disposed within the via-hole.

The piezoelectric material 222 having polarization properties may be disposed between the first electrode layer 221 and the second electrode layer 223.

The piezoelectric material 222 may be a compound in which a positive (+) polarity material and a negative (−) polarity material are combined, or may be a material in which a displacement occurs due to polarization properties when an electric field is applied thereto. For example, the piezoelectric material 222 may be a compound having a bonding structure of formula AB, and may be, but is not limited to, AlN or ZnO. In particular, the μLED 210 and the piezoelectric device 220 may be easily integrated using AlN, i.e. a nitride-based compound.

Describing an exemplary process of fabricating the light-emitting audio device 200, the first semiconductor layer 211, the active layer 212, and the second semiconductor layer 213 are grown on a sapphire substrate by an epitaxial process.

When the growth of the μLED 210 without electrodes is completed, the first semiconductor layer 211 is separated from the sapphire substrate. For example, the first semiconductor layer 211 may be separated from the sapphire substrate by irradiating the bottom surface of the sapphire substrate with a laser beam (laser lift-off: LLO).

The separated μLED 210 is inverted, and the insulator 230 is disposed on the μLED 210. The second electrode layer 223, the piezoelectric material 222, and the first electrode layer 221 are disposed on the insulator 230, thereby forming the piezoelectric device 220 in which no electrodes are provided.

The μLED 210 and the piezoelectric device 220 are inverted again, the protective portion 240 is formed, and then via-holes for the electrical connection of electrodes are formed.

Insulating materials may be disposed within the via-holes. The first light-emitting electrode 214, the second light-emitting electrode 215, the first audio electrode 224, and the second audio electrode 225 are provided on the protective portion 240 so as to be electrically connected to the first semiconductor layer 211, the second semiconductor layer 213, the first electrode layer 221, and the second electrode layer 223, respectively.

As described above, since the light-emitting audio device 200 is configured such that the μLED 210 and the piezoelectric device 220 are stacked on each other, it is possible to display an image and output audio using a single device.

The light-emitting audio device 200 can express a level of brightness by generating light from the active layer 212 in response to a negative voltage and a positive voltage applied to the first light-emitting electrode 214 and the second light-emitting electrode 215 of the μLED 210.

In addition, the light-emitting audio device 200 can output audio by controlling the piezoelectric material 222 to oscillate in response to a voltage applied to the first audio electrode 224 and the second audio electrode 225 of the piezoelectric device 220.

Figure 4:
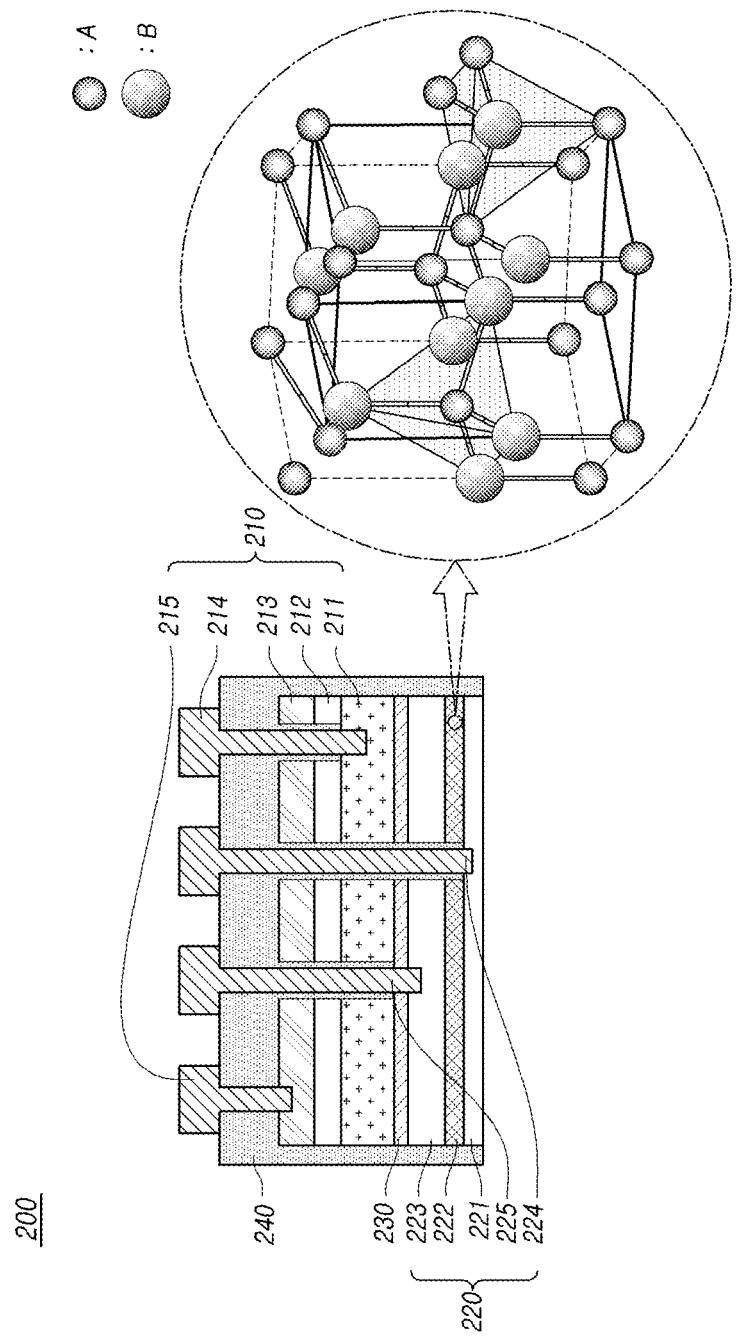
FIG. 4 illustrates an exemplary structure of the piezoelectric material of the light-emitting audio device according to exemplary embodiments.
Figure 5:
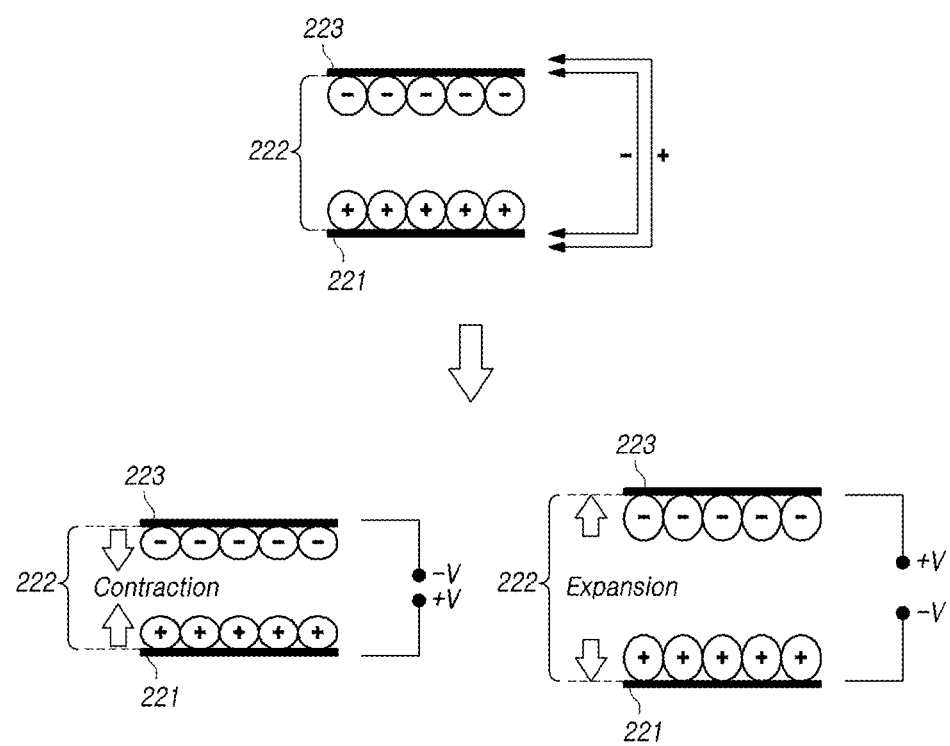
FIG. 5 illustrates the principle by which the light-emitting audio device according to exemplary embodiments outputs audio.

FIG. 4 illustrates the structure of the piezoelectric material 222 of the light-emitting audio device 200 according to exemplary embodiments, and FIG. 5 illustrates the principle of generating oscillations using the polarization properties of the piezoelectric material 222.

Referring to FIG. 4, the piezoelectric material 222 of the piezoelectric device 220, included in the light-emitting audio device 200 according to exemplary embodiments, may be a compound having a bonding structure of formula AB.

The piezoelectric material 222 may be a compound in which a positive (+) polarity material and a negative (−) polarity material are combined in a one-to-one ratio. As described above, the piezoelectric material 222 may be a compound, such as AlN or ZnO.

When the piezoelectric material 222 is AlN, Al is a group III element having negative (−) polarity, and N is a group V element having positive (+) polarity. Due to the structure in which Al having negative (−) polarity and N having positive (+) polarity are combined in a one-to-one ratio, spontaneous polarization properties are obtained. When an electric field is applied to the piezoelectric material 222, displacement may occur due to polarization properties.

Referring to FIG. 5, the piezoelectric device 220 of the light-emitting audio device 200 according to exemplary embodiments includes the n-doped first electrode layer 221, the p-doped second electrode layer 223, and the piezoelectric material 222 disposed between the first electrode layer 221 and the second electrode layer 223.

In addition, a voltage may be applied to the first electrode layer 221 via the first audio electrode 224, and a voltage may be applied to the second electrode layer 223 via the second audio electrode 225.

Since the piezoelectric material 222 has a one-to-one bonding structure of the positive (+) polarity material and the negative (−) polarity material, when no voltages are applied to the first electrode 221 and the second electrode layer 223, the positive (+) polarity material may indicate a displacement to the n-doped first electrode layer 221, and the negative (−) polarity material may indicate a displacement to the p-doped second electrode layer 223.

When a positive or negative voltage is applied to the first electrode 221 and the second electrode 223 via the first audio electrode 224 and the second audio electrode 225, a displacement occurring in the piezoelectric material 222 may cause the piezoelectric device 220 to expand or contract.

The contraction or expansion of the piezoelectric device 220 due to the displacement of the piezoelectric material 222 may generate oscillations.

For example, a positive voltage may be applied to the n-doped first electrode layer 221, while a negative voltage may be applied to the p-doped second electrode layer 223.

When the positive voltage is applied to the first electrode layer 221, the positive (+) polarity material, indicating a displacement to the first electrode layer 221 when no voltage is applied to the first electrode layer 221, may move in a direction opposite to the first electrode layer 221. That is, a displacement may be generated by the repulsive force between the first electrode layer 221 and the positive (+) polarity material of the piezoelectric material 222.

In addition, when the negative voltage is applied to the second electrode layer 223, the negative (−) polarity material, indicating a displacement to the second electrode layer 223 when no voltage is applied to the second electrode layer 223, may move in a direction opposite to the second electrode layer 223. That is, a displacement may be generated by the repulsive force between the second electrode layer 223 and the negative (−) polarity material of the piezoelectric material 222.

Accordingly, the piezoelectric device 220 may be contracted due to the property in which the positive (+) polarity material and the negative (−) polarity material of the piezoelectric material 222 move in directions opposite to the electrode layer.

In contrast, when a negative voltage is applied to the first electrode layer 221, and a positive electrode is applied to the second electrode layer 223, the piezoelectric material 222 may exhibit a different displacement.

When a negative voltage is applied to the first electrode layer 221, the positive (+) polarity material may move in the direction of the first electrode layer 221 by the attractive force between the positive (+) polarity material and the first electrode layer 221 to which the negative voltage is applied. When a positive voltage is applied to the second electrode layer 223, the negative (−) polarity material may move in the direction of the second electrode layer 223 by the attractive force between the negative (−) polarity material and the second electrode layer 223 to which the positive voltage is applied.

Accordingly, the piezoelectric device 220 may be expanded due to the property in which the positive (+) polarity material and the negative (−) polarity material of the piezoelectric material 222 move in the direction of the electrode layer.

That is, it is possible to expand and contract the piezoelectric device 220 by alternatingly apply a positive voltage and a negative voltage to the first electrode layer 221 and the second electrode layer 223 of the piezoelectric device 220, so that the piezoelectric device 220 oscillates.

As described above, due to the oscillations of the piezoelectric device 220 of the light-emitting audio device 200, the display device 100 with the light-emitting audio device 200 being disposed therein can output audio. Accordingly, it is possible to provide the display device 100 able to display images while outputting audio.

In addition, it is possible to provide an audio output device by disposing the light-emitting audio device 200 on a substrate. It is possible to provide an audio output device by generating oscillations using the light-emitting audio device 200 disposed on the substrate. For example, a lighting device able to output audio can be provided.

The light-emitting audio device 200 may be more easily provided by changing the arrangement of the μLED 210 and the piezoelectric device 220.

Figure 6:
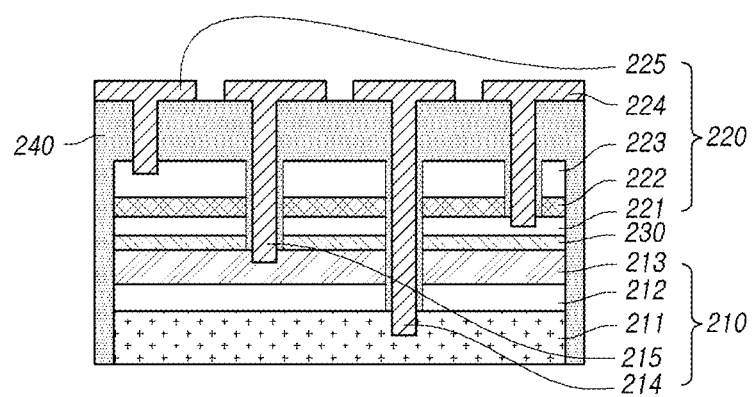
FIG. 6 illustrates another exemplary cross-sectional structure of the light-emitting audio device according to exemplary embodiments.

FIG. 6 illustrates another exemplary structure of the light-emitting audio device 200 according to exemplary embodiments.

Referring to FIG. 6, the light-emitting audio device 200 according to exemplary embodiments may be configured such that the μLED 210 and the piezoelectric device 220 are stacked on each other, with the piezoelectric device 220 being located above the μLED 210.

Describing an exemplary process of fabricating the light-emitting audio device 200, the first semiconductor layer 211, the active layer 212, and the second semiconductor layer 213 are grown on a sapphire substrate by an epitaxial process.

When the growth of the second semiconductor layer 213 is completed, the insulator 230 is disposed on the second semiconductor layer 213.

Afterwards, the first electrode layer 221, the piezoelectric material 222, and the second electrode layer 223 are sequentially formed on the insulator 230.

The protective portion 240 is formed on the second electrode layer 223, and via-holes for electrical connection of electrodes are formed in the protective portion 240, the μLED 210, and the piezoelectric device 220.

The first light-emitting electrode 214, the second light-emitting electrode 215, the first audio electrode 224, and the second audio electrode 225 are formed on the protective portion 240 to be electrically connected to the first semiconductor layer 211, the second semiconductor layer 213, the first electrode layer 221, and the second electrode layer 223, respectively, thereby forming the light-emitting audio device 200.

The light-emitting audio device 200 is separated from the sapphire substrate, thereby completing the process.

Since the piezoelectric device 220 is formed on the μLED 210 after the growth of the μLED 210, the light-emitting audio device 200 may be easily provided without the process of separating and inverting the μLED 210.

In addition, the light-emitting audio device 200 may be configured such that the μLED 210 and the piezoelectric device 220 are disposed in a horizontal direction.

Figure 7:
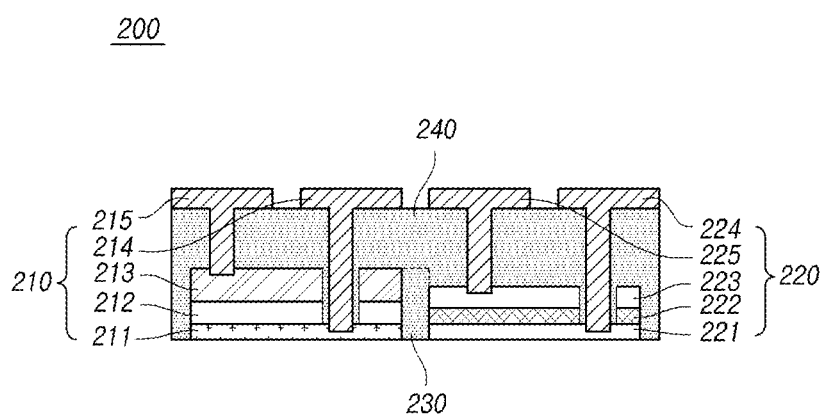
FIG. 7 further illustrates another exemplary cross-sectional structure of the light-emitting audio device according to exemplary embodiments.

FIG. 7 further illustrates another exemplary structure of the light-emitting audio device 200 according to exemplary embodiments.

Referring to FIG. 7, the light-emitting audio device 200 according to exemplary embodiments may be configured such that the piezoelectric device 220 is disposed on one side of the μLED 210.

The μLED 210 is configured such that the first semiconductor layer 211, the active layer 212, and the second semiconductor layer 213 are stacked on each other. The piezoelectric device 220 including the first electrode layer 221, the piezoelectric material 222, and the second electrode layer 223, which are stacked on each other, may be disposed on one side of the μLED 210.

The insulator 230 may be disposed between the side surface of the μLED 210 and the side surface of the piezoelectric device 220. The protective portion 240 may be disposed covering the top surface and the side surfaces of the μLED 210 and the piezoelectric device 220. The insulator 230 may be made of the same material as the protective portion 240, and may be formed in the process of disposing the protective portion 240.

The first light-emitting electrode 214 electrically connected to the first semiconductor layer 211, the second light-emitting electrode 215 electrically connected to the second semiconductor layer 213, the first audio electrode 224 electrically connected to the first electrode layer 221, and the second audio electrode 225 electrically connected to the second electrode layer 221 may be formed on the protective portion 240, thereby providing the light-emitting audio device 200.

Since the processing conditions of the μLED 210 may be different from the processing conditions of the piezoelectric device 220, the μLED 210 and the piezoelectric device 220 may be disposed in the horizontal direction instead of being stacked on each other. This can consequently be advantageous in terms of processing when fabricating the light-emitting audio device 200.

The light-emitting audio device 200 may be disposed on the display panel 110 to enable the functions of displaying images and outputting audio. Since the light-emitting audio device 200 is disposed in each of the subpixels SP, display driving and audio output can be performed for each of the areas.

Figure 8:
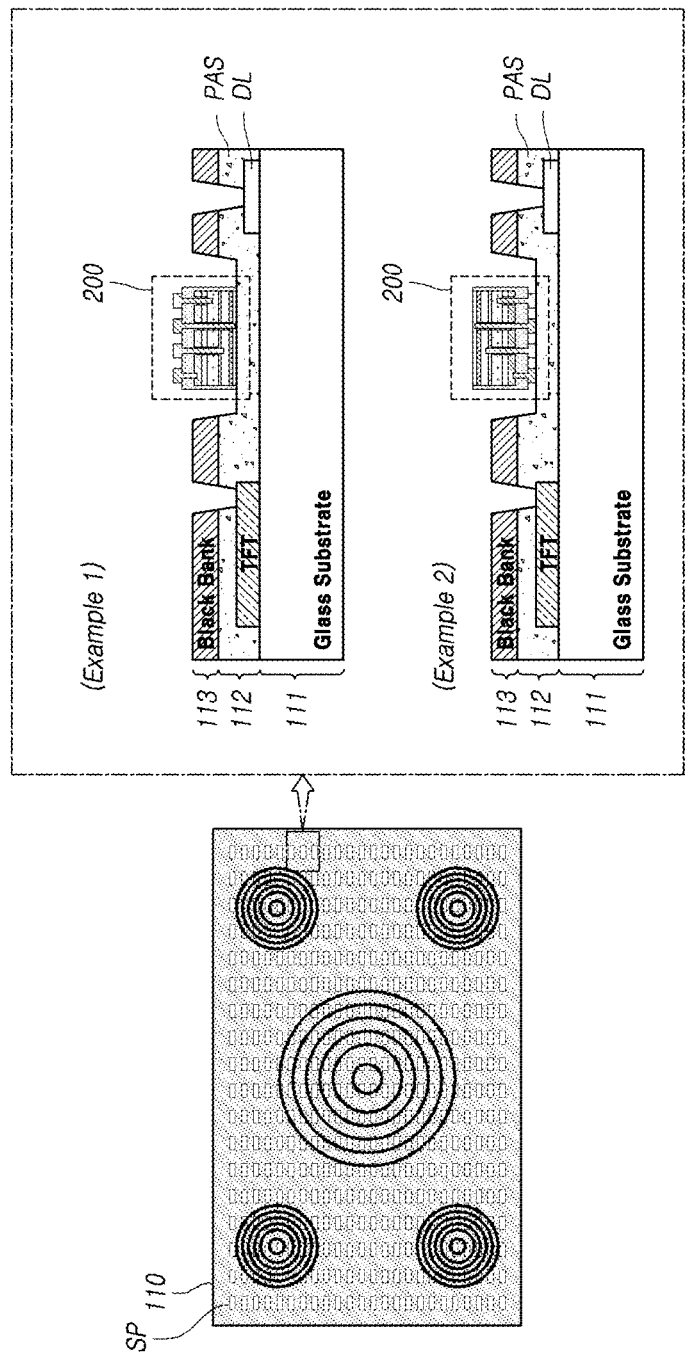
FIG. 8 further illustrates another exemplary cross-sectional structure of the light-emitting audio device according to exemplary embodiments.

FIG. 8 further illustrates an exemplary structure of the light-emitting audio device 200 according to exemplary embodiments, disposed on the display panel 110.

Referring to FIG. 8, a transistor layer 112 is disposed on the substrate 111 of the display panel 110. Transistors, signal lines, and the like for the driving of each of the subpixels SP are disposed in the transistor layer 112. In addition, a bank layer 113 may be provided on the transistor layer 112 except for a light-emitting area, i.e. a circuit area of the transistor layer 112, to protect circuit elements and the like.

The light-emitting audio device 200 may be disposed in the light-emitting area of each of the subpixels SP on the transistor layer 112 of the display panel 110.

The light-emitting audio device 200, as described above, can display an image by generating light using the active layer 212 disposed in each of the subpixels SP, in response to voltages applied to the first light-emitting electrode 214 and the second light-emitting electrode 215.

In addition, the light-emitting audio device 200 can output audio by oscillating in response to voltages applied to the first audio electrode 224 and the second audio electrode 225.

Since a plurality of light-emitting audio devices 200, as described above, are disposed in the subpixels SP, respectively, audio output can be performed according to the areas of the display panel 110. That is, since the image display and audio output functions are provided using the light-emitting audio devices 200 respectively disposed in a subpixel among the plurality of subpixels SP corresponding thereto, display driving and audio output can be performed according to the areas of the display panel 110.

Area-specific display driving using the light-emitting audio devices 200 can be performed using the data driver circuit 130. In addition, area-specific audio generation can be performed using a separate driver circuit.

Figure 9:
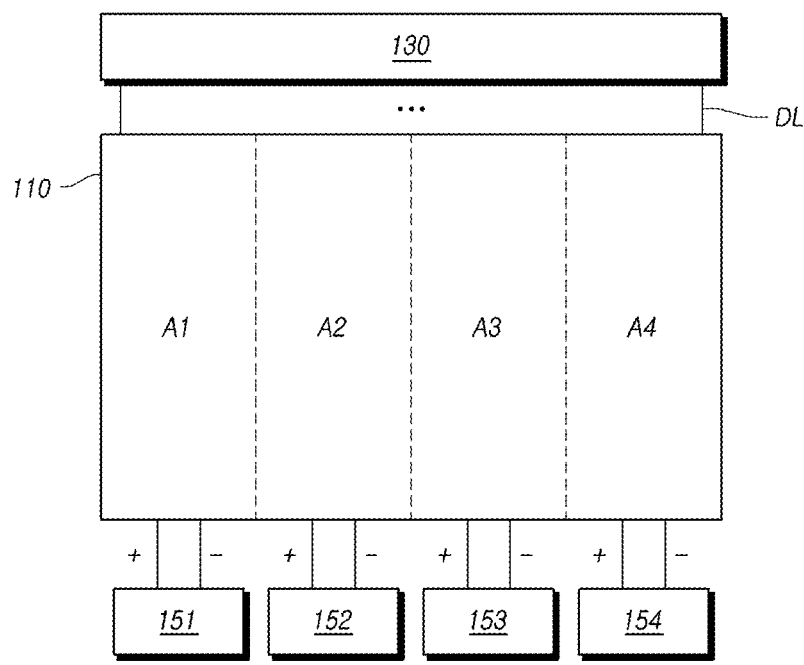
FIGS. 9 and 10 illustrate exemplary methods of outputting audio from a display device in which the light-emitting audio devices according to exemplary embodiments are disposed.
Figure 10:
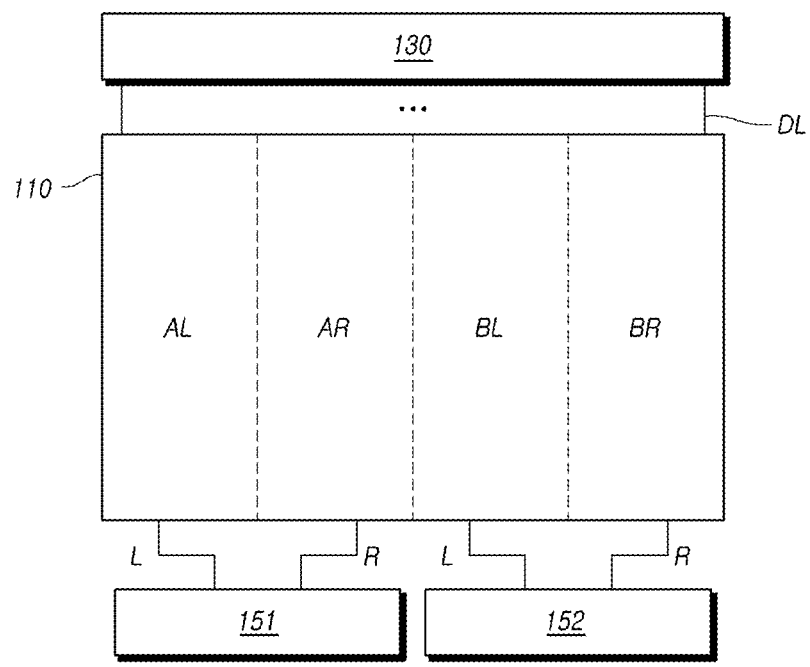

FIGS. 9 and 10 illustrate exemplary methods of outputting audio from the display device 100 in which the light-emitting audio devices 200 according to exemplary embodiments are disposed.

Referring to FIG. 9, in the display device 100 according to exemplary embodiments, the light-emitting audio devices 200 are disposed in the subpixels SP of the display panel 110, respectively.

The light-emitting audio devices 200 may be driven by the data driver circuit 130 to display images.

In addition, the light-emitting audio devices 200 may be driven by audio driver circuits 151, 152, 153, and 154 to output audio. The light-emitting audio devices 200 may be driven by different audio driver circuits 151, 152, 153, and 154, depending on the areas in which the light-emitting audio devices 200 are disposed, so that audio can be output in an area-specific manner.

For example, the light-emitting audio devices 200 disposed in the subpixels SP of the display panel 110 may be driven, divided into four areas A1, A2, A3, and A4. Partitions or ribs may be disposed between the four areas, thereby defining audio output areas.

The area A1 may be driven by the first audio driver circuit 151, while the areas A2, A3, and A4 may be driven by the second to fourth audio driver circuits 152, 153, and 154, respectively.

The audio driver circuits 151, 152, 153, and 154 can control the piezoelectric devices 220 of the light-emitting audio devices 200 to oscillate by controlling positive and negative voltages to be alternatingly applied to the first electrode layers 221 and the second electrode layers 223 of the light-emitting audio devices 200 disposed in the subpixels SP.

In addition, a four-channel speaker can be provided by setting the light-emitting audio devices 200 to oscillate differently, depending on the areas A to D.

In addition, two areas among the divided areas in the display panel 110 may be set to output the same audio, thereby enabling stereophonic audio generation.

Referring to FIG. 10, the display panel 110 may be comprised of areas AL and AR outputting the same audio and other areas BL and BR outputting the same audio.

The areas AL and AR in the display panel 110 may be driven by the first audio driver circuit 151, while the areas BL and BR may be driven by the second audio driver circuit 152.

The first audio driver circuit 151 can control the light-emitting audio device 200 to output the same audio from the area AL and the area AR, so that stereophonic audio can be generated. In addition, the second audio driver circuit 152 can control the light-emitting audio device 200 to output the same audio from the area BL and the area BR.

Accordingly, it is possible to provide a two-channel stereophonic speaker by driving the display panel 110, divided into the four areas, using the two audio driver circuits 151 and 152.

FIGS. 9 and 10 illustrate exemplary area-specific audio generation of the display panel 110 in which the light-emitting audio devices 200 according to exemplary embodiments are disposed. According to exemplary embodiments, a variety of types of speakers can be provided, using the feature that the light-emitting audio device 200 disposed in the subpixels SP, respectively, can be driven separately.

According to exemplary embodiments, it is possible to display an image and output audio using a single device, since the light-emitting audio device 200 is configured such that the μLED 210 and the piezoelectric device 220 are integrated with each other.

In addition, since the piezoelectric material 222 of the piezoelectric device 220 is made of a compound having a bonding structure of formula AB, the μLED 210 and the piezoelectric device 220 can be easily integrated with each other.

Furthermore, since the light-emitting audio devices 200 disposed in the subpixels SP of the display panel 110 can output audio, the display device 100 can generate audio without speakers, which would otherwise increase the thickness thereof. The ability of audio output according to the areas of the display panel 110 makes it possible to provide a variety of types of speakers.

It will be apparent to those skilled in the art that various modifications and variations can be made in the light-emitting audio device, the audio output device, and the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light-emitting audio device, comprising:
a light-emitting diode comprising a first semiconductor layer, a second semiconductor layer, and an active layer disposed between the first semiconductor layer and the second semiconductor layer;
a piezoelectric device comprising a first electrode layer, a second electrode layer, and a piezoelectric material disposed between the first electrode layer and the second electrode layer;
an insulator disposed between the light-emitting diode and the piezoelectric device;
a protective layer disposed on a surface of at least one of the light-emitting diode and the piezoelectric device; and
a plurality of electrodes located on the protective layer to be electrically connected to the light-emitting diode or the piezoelectric device,
wherein at least one electrode among the plurality of electrodes is located in a via-hole which passes through at least one of the active layer and the piezoelectric material.

2. The light-emitting audio device according to claim 1, wherein the light-emitting diode, the insulator, and the piezoelectric device are stacked on each other.

3. The light-emitting audio device according to claim 1, wherein the piezoelectric device is located on a side of the light-emitting diode, and
the insulator is disposed between a side surface of the light-emitting diode and a side surface of the piezoelectric device.

4. The light-emitting audio device according to claim 1, wherein at least one electrode among the plurality of electrodes is directly connected to the light-emitting diode or piezoelectric device by the via-hole located within at least one of the light-emitting diode and the piezoelectric device.

5. The light-emitting audio device according to claim 4, wherein one electrode among the plurality of electrodes is electrically connected to one of the first semiconductor layer, the second semiconductor layer, the first electrode layer, and the second electrode layer while being insulated from the other ones of the first semiconductor layer, the second semiconductor layer, the first electrode layer, and the second electrode layer.

6. The light-emitting audio device according to claim 5, wherein the plurality of electrodes include:
a first light-emitting electrode electrically connected to the first semiconductor layer;
a second light-emitting electrode electrically connected to the second semiconductor layer;
a first audio electrode electrically connected to the first electrode layer; and
a second audio electrode electrically connected to the second electrode layer.

7. The light-emitting audio device according to claim 1, wherein the piezoelectric material of the piezoelectric device comprises a compound having a crystal structure of formula AB.

8. The light-emitting audio device according to claim 1, wherein a part of the protective layer is located in the via-hole.

9. The light-emitting audio device according to claim 1, wherein the via-hole passes through the insulator, and the protective layer is in contact with the insulator inside the via-hole.

10. The light-emitting audio device according to claim 1, wherein at least one of the first semiconductor layer and the second semiconductor layer is separated from at least one of the first electrode layer and the second electrode layer by the insulator, and
wherein a part of the insulator is in contact with the protective layer.

11. The light-emitting audio device according to claim 1, wherein the plurality of electrodes are located within an area where overlaps with the active layer and the piezoelectric material.

12. An audio output device, comprising:
a substrate;
a plurality of light-emitting audio devices disposed on the substrate; and
a first driver circuit and a second driver circuit driving the plurality of light-emitting audio devices,
wherein each of the plurality of light-emitting audio devices comprises:
a light-emitting diode comprising a first semiconductor layer, a second semiconductor layer, and an active layer disposed between the first semiconductor layer and the second semiconductor layer;
a piezoelectric device comprising a first electrode layer, a second electrode layer, and a piezoelectric material disposed between the first electrode layer and the second electrode layer;
an insulator disposed between the light-emitting diode and the piezoelectric device;
a protective layer disposed on a surface of at least one of the light-emitting diode and the piezoelectric device; and
a plurality of electrodes located on the protective layer to be electrically connected to the light-emitting diode or the piezoelectric device, wherein at least one electrode among the plurality of electrodes is located in a via-hole which passes through at least one of the active layer and the piezoelectric material.

13. The audio output device according to claim 12, wherein, in each of the plurality of light-emitting audio devices, one electrode among the plurality of electrodes is electrically connected to one of the first semiconductor layer, the second semiconductor layer, the first electrode layer, and the second electrode layer by the via-hole located within at least one of the light-emitting diode and the piezoelectric device while being insulated from the other ones of the first semiconductor layer, the second semiconductor layer, the first electrode layer, and the second electrode layer.

14. The audio output device according to claim 13, wherein the plurality of electrodes include:
   a first light-emitting electrode electrically connected to the first semiconductor layer;
   a second light-emitting electrode electrically connected to the second semiconductor layer;
   a first audio electrode electrically connected to the first electrode layer; and
   a second audio electrode electrically connected to the second electrode layer.

15. The audio output device according to claim 14, wherein the first driver circuit controls a first polarity voltage to be applied to the first light-emitting electrode and a second polarity voltage to be applied to the second light-emitting electrode, and
   the second driver circuit controls the second polarity voltage to be applied to the second audio electrode when the first polarity voltage is applied to the first audio electrode and the first polarity voltage to be applied to the second audio electrode when the second polarity voltage is applied to the first audio electrode.

16. A display device, comprising:
   a panel on which a plurality of gate lines, a plurality of data lines, and a plurality of subpixels are disposed;
   a plurality of light-emitting audio devices disposed in the plurality of subpixels, respectively; and
   a first driver circuit and a second driver circuit driving the plurality of light-emitting audio devices,
   wherein each of the plurality of light-emitting audio devices comprises:
      a light-emitting diode comprising a first semiconductor layer, a second semiconductor layer, and an active layer disposed between the first semiconductor layer and the second semiconductor layer;
      a piezoelectric device comprising a first electrode layer, a second electrode layer, and a piezoelectric material disposed between the first electrode layer and the second electrode layer;
      an insulator disposed between the light-emitting diode and the piezoelectric device;
      a protective layer disposed on a surface of at least one of the light-emitting diode and the piezoelectric device; and
      a plurality of electrodes located on the protective layer to be electrically connected to the light-emitting diode or the piezoelectric device,
   wherein at least one electrode among the plurality of electrodes is located in a via-hole which passes through at least one of the active layer and the piezoelectric material.

17. The display device according to claim 16, wherein, in each of the plurality of light-emitting audio devices, one electrode among the plurality of electrodes is electrically connected to one of the first semiconductor layer, the second semiconductor layer, the first electrode layer, and the second electrode layer by the via-hole located within at least one of the light-emitting diode and the piezoelectric device while being insulated from the other ones of the first semiconductor layer, the second semiconductor layer, the first electrode layer, and the second electrode layer.

18. The display device according to claim 17, wherein the plurality of electrodes include:
   a first light-emitting electrode electrically connected to the first semiconductor layer;
   a second light-emitting electrode electrically connected to the second semiconductor layer;
   a first audio electrode electrically connected to the first electrode layer; and
   a second audio electrode electrically connected to the second electrode layer.

19. The display device according to claim 18, wherein the first driver circuit controls a first polarity voltage to be applied to the first light-emitting electrode and a second polarity voltage to be applied to the second light-emitting electrode, and
   the second driver circuit controls the second polarity voltage to be applied to the second audio electrode when the first polarity voltage is applied to the first audio electrode and the first polarity voltage to be applied to the second audio electrode when the second polarity voltage is applied to the first audio electrode.

* * * * *